United States Patent
Heng et al.

(10) Patent No.: US 9,391,230 B1
(45) Date of Patent: Jul. 12, 2016

(54) METHOD FOR IMPROVING SOLAR CELL MANUFACTURING YIELD

(71) Applicants: SolarCity Corporation, San Mateo, CA (US); Sierra Solar Power (Hangzhou) Co., Ltd., Hangzhou (CN)

(72) Inventors: Jiunn Benjamin Heng, Los Altos Hills, CA (US); Chunguang Xiao, Hangzhou (CN); Dongzhi Yan, Hangzhou (CN); Jiansheng Zhou, Hangzhou (CN); Zhiquan Huang, Hayward, CA (US); Zheng Xu, Pleasanton, CA (US)

(73) Assignees: SolarCity Corporation, San Mateo, CA (US); Sierra Solar Power (Hangzhou) Co., Ltd., Hangzhou (CN)

( * ) Notice: Subject to any disclaimer, the term of this patent is extended or adjusted under 35 U.S.C. 154(b) by 0 days.

(21) Appl. No.: 14/830,633

(22) Filed: Aug. 19, 2015

(30) Foreign Application Priority Data

Feb. 17, 2015 (WO) ................ PCT/CN2015/073221

(51) Int. Cl.
*H01L 31/18* (2006.01)
*B01D 53/14* (2006.01)
*F24F 3/16* (2006.01)

(52) U.S. Cl.
CPC ............ *H01L 31/1804* (2013.01); *B01D 53/14* (2013.01); *B01D 53/1468* (2013.01); *B01D 53/1487* (2013.01); *F24F 3/16* (2013.01); *B01D 2257/302* (2013.01); *B01D 2257/304* (2013.01);
(Continued)

(58) Field of Classification Search
CPC ............ H01L 21/677; H01L 21/67703; H01L 21/67706; H01L 21/67724; H01L 21/67727; H01L 21/6773; H01L 21/67739; H01L 21/67769; Y10S 118/90; Y10S 206/832; Y10S 206/833; Y10S 414/135; Y10S 414/14; Y10S 438/905
USPC ..................... 414/935, 940; 438/14
See application file for complete search history.

(56) References Cited

U.S. PATENT DOCUMENTS

| 3,603,284 A | 9/1971 | Garnache |
| 3,658,585 A | 4/1972 | Folkmann |
| 4,193,756 A | 3/1980 | Leon |

(Continued)

FOREIGN PATENT DOCUMENTS

| JP | H11288890 A | 10/1999 |
| JP | 2003158054 A | 5/2003 |

(Continued)

OTHER PUBLICATIONS

Beaucarne, G et al., "Epitaxial thin-film Si solar cells", pp. 533-542, Science Direct, www.sciencedirect.com, Thin Solid Films 511-512 (2006) 533-542.

*Primary Examiner* — Earl Taylor
(74) *Attorney, Agent, or Firm* — Shun Yao; Park, Vaughan, Fleming & Dowler LLP

(57) ABSTRACT

A method is described for protecting photovoltaic cells. During the fabrication process, a photovoltaic cell can be received from a first processing station. The photovoltaic cell can have at least one exposed surface, which may include crystalline silicon or oxidized crystalline silicon. The photovoltaic cell can then be placed in a controlled microenvironment with controlled chemical content, which can protect the exposed surface of the photovoltaic cell from contamination. Subsequently, the photovoltaic cell can be moved toward and delivered to a second processing station in the controlled microenvironment.

17 Claims, 8 Drawing Sheets

(52) U.S. Cl.
    CPC ..... *B01D 2257/404* (2013.01); *B01D 2257/406* (2013.01); *B01D 2257/708* (2013.01)

(56) References Cited

U.S. PATENT DOCUMENTS

| | | | |
|---|---|---|---|
| 4,668,484 A * | 5/1987 | Elliott | H01L 21/67393 206/207 |
| 4,839,145 A | 6/1989 | Gale | |
| 4,858,558 A | 8/1989 | Ohmura | |
| 4,867,629 A * | 9/1989 | Iwasawa | H01L 21/67769 211/163 |
| 4,967,645 A * | 11/1990 | Mattson | F24F 9/00 15/316.1 |
| 5,038,711 A | 8/1991 | Dan | |
| 5,074,245 A | 12/1991 | Ota | |
| 5,119,540 A | 6/1992 | Kong | |
| 5,269,847 A | 12/1993 | Anderson | |
| 5,351,415 A * | 10/1994 | Brooks | F26B 21/003 141/85 |
| 5,505,778 A | 4/1996 | Ono | |
| 5,614,447 A | 3/1997 | Yamaga | |
| 5,700,422 A | 12/1997 | Usui | |
| 5,993,555 A | 11/1999 | Hamilton | |
| 5,994,675 A | 11/1999 | Bethune | |
| 6,120,605 A | 9/2000 | Sato | |
| 6,122,566 A * | 9/2000 | Nguyen | H01L 21/67167 438/908 |
| 6,193,804 B1 | 2/2001 | Chang | |
| 6,214,116 B1 | 4/2001 | Shin | |
| 6,262,393 B1 | 7/2001 | Imai | |
| 6,399,510 B1 | 6/2002 | Riley | |
| 6,472,639 B2 | 10/2002 | Nishitani | |
| 6,478,923 B1 | 11/2002 | Igarashi | |
| 6,637,998 B2 * | 10/2003 | Langan | H01L 21/67724 414/217 |
| 6,679,672 B1 * | 1/2004 | Barrows | H01L 21/67017 414/217 |
| 6,808,352 B2 * | 10/2004 | Seita | H01L 21/67379 414/217.1 |
| 7,293,950 B2 * | 11/2007 | Bonora | H01L 21/67766 104/282 |
| 7,313,452 B2 * | 12/2007 | Kobayashi | G06Q 10/04 414/222.01 |
| 7,357,842 B2 * | 4/2008 | Ishikawa | G03B 27/32 118/50 |
| 7,410,340 B2 * | 8/2008 | Bonora | H01L 21/67775 198/463.3 |
| 7,897,525 B2 * | 3/2011 | Lei | H01L 21/67173 414/935 |
| 7,988,399 B2 * | 8/2011 | van der Meulen | H01L 21/67161 414/217 |
| 8,110,511 B2 * | 2/2012 | Lei | H01L 21/67161 414/935 |
| 8,246,284 B2 * | 8/2012 | Borden | C23C 14/566 414/217 |
| 8,268,734 B2 * | 9/2012 | Lei | H01L 21/67173 414/935 |
| 8,288,645 B2 | 10/2012 | Lee | |
| 8,367,565 B2 * | 2/2013 | Lei | B05D 3/04 414/935 |
| 8,500,388 B2 * | 8/2013 | van der Meulen | B65G 25/02 414/805 |
| 8,898,930 B2 * | 12/2014 | Godot | F26B 5/04 134/1 |
| 9,022,714 B2 * | 5/2015 | Lee | H01L 21/67173 414/217 |
| 9,105,673 B2 * | 8/2015 | Babbs | H01L 21/67201 |
| 2002/0004309 A1 | 1/2002 | Collins | |
| 2002/0102859 A1 | 8/2002 | Yoo | |
| 2003/0012885 A1 | 1/2003 | Gramarossa | |
| 2003/0019428 A1 | 1/2003 | Ku | |
| 2005/0016956 A1 | 1/2005 | Liu | |
| 2005/0105991 A1 * | 5/2005 | Hofmeister | H01L 21/67161 414/217 |
| 2005/0226794 A1 * | 10/2005 | Hodge | G05B 15/02 422/243 |
| 2006/0006559 A1 | 1/2006 | Nakagawa | |
| 2006/0191118 A1 | 8/2006 | Lee | |
| 2006/0201414 A1 | 9/2006 | Brabant | |
| 2007/0051314 A1 * | 3/2007 | Choi | C23C 14/566 118/719 |
| 2007/0131173 A1 | 6/2007 | Halpin | |
| 2008/0276451 A1 * | 11/2008 | Morad | H01L 21/67745 29/742 |
| 2009/0067957 A1 * | 3/2009 | Ando | B65G 37/02 414/222.05 |
| 2009/0117746 A1 | 5/2009 | Masuda | |
| 2009/0139570 A1 | 6/2009 | Kinoshita | |
| 2009/0311869 A1 | 12/2009 | Okesaku | |
| 2010/0009489 A1 * | 1/2010 | Tu | C23C 16/4401 438/64 |
| 2010/0029067 A1 * | 2/2010 | Vijh | C23C 14/562 438/478 |
| 2010/0047954 A1 * | 2/2010 | Su | B26F 3/002 438/61 |
| 2010/0162954 A1 * | 7/2010 | Lei | C23C 14/568 118/723 R |
| 2010/0167503 A1 * | 7/2010 | Lei | H01L 21/67173 438/478 |
| 2010/0173439 A1 * | 7/2010 | Lei | H01L 21/67161 438/57 |
| 2010/0183825 A1 | 7/2010 | Becker | |
| 2010/0263587 A1 | 10/2010 | Sivaramakrishnan | |
| 2010/0273279 A1 * | 10/2010 | Su | H01L 21/67092 438/17 |
| 2010/0282272 A1 * | 11/2010 | Godot | F26B 5/04 134/1 |
| 2011/0033638 A1 * | 2/2011 | Ponnekanti | C23C 16/45519 427/569 |
| 2011/0033957 A1 * | 2/2011 | Holden | G01B 11/0683 438/16 |
| 2011/0067632 A1 | 3/2011 | Poppe | |
| 2011/0151119 A1 * | 6/2011 | Lei | H01L 21/67173 427/248.1 |
| 2011/0217469 A1 * | 9/2011 | Lei | B05D 3/04 427/314 |
| 2011/0245957 A1 * | 10/2011 | Porthouse | H01L 21/67109 700/114 |
| 2011/0262252 A1 * | 10/2011 | Lee | H01L 21/67173 414/222.07 |
| 2011/0263070 A1 * | 10/2011 | Schaeffer | H01L 21/6715 438/84 |
| 2011/0285840 A1 * | 11/2011 | Benson | G01N 21/95684 348/87 |
| 2012/0315395 A1 * | 12/2012 | Kuribe | H01L 21/67781 427/255.5 |
| 2012/0318340 A1 * | 12/2012 | Heng | H01L 31/0745 136/255 |
| 2013/0171757 A1 * | 7/2013 | Ponnekanti | H01L 31/18 438/57 |
| 2013/0269602 A1 * | 10/2013 | Miyamoto | H01L 31/186 118/66 |
| 2015/0303079 A1 * | 10/2015 | Oosterlaken | H01L 21/6719 432/258 |

FOREIGN PATENT DOCUMENTS

| | | | |
|---|---|---|---|
| JP | 2003277936 A | | 10/2003 |
| JP | 2006080098 A | | 3/2006 |
| KR | 20050003763 A | * | 1/2005 |
| KR | 20060117134 A | | 11/2006 |
| WO | WO 2009029901 A1 | * | 3/2009 |
| WO | WO 2010129136 A2 | * | 11/2010 ........ H01L 21/67092 |
| WO | WO 2010129136 A3 | * | 1/2011 ........ H01L 21/67092 |

* cited by examiner

METHOD FOR IMPROVING SOLAR CELL MANUFACTURING YIELD

CROSS-REFERENCE TO OTHER APPLICATIONS

Under 35 U.S.C. 119, this claims the benefit of PCT Application No. PCT/CN2015/073221, entitled "METHOD AND SYSTEM FOR IMPROVING SOLAR CELL MANUFACTURING YIELD," filed Feb. 17, 2015, the disclosures of which are incorporated herein by reference in their entirety for all purposes.

BACKGROUND

1. Field

This is generally related to the manufacture of photovoltaic cells. More specifically, this disclosure is related to a method for improving the yield of photovoltaic cell manufacture.

2. Related Art

The negative environmental impact of fossil fuels and their rising cost have resulted in a dire need for cleaner, cheaper alternative energy sources. Among different forms of alternative energy sources, photovoltaic power has been favored for its cleanness and wide availability.

A photovoltaic cell converts light into electricity using the photovoltaic effect. There are several basic photovoltaic cell structures, including a single p-n junction, p-i-n/n-i-p, and multi-junction. A typical single p-n junction structure includes a p-type doped layer and an n-type doped layer. Photovoltaic cells with a single p-n junction can be homojunction photovoltaic cells or heterojunction photovoltaic cells. If both the p-doped and n-doped layers are made of similar materials (materials with equal bandgaps), the photovoltaic cell is called a homojunction photovoltaic cell. In contrast, a heterojunction photovoltaic cell includes at least two layers of materials of different bandgaps. A p-i-n/n-i-p structure includes a p-type doped layer, an n-type doped layer, and an intrinsic (undoped) semiconductor layer (the i-layer) sandwiched between the p-layer and the n-layer. A multi-junction structure includes multiple single-junction structures of different bandgaps stacked on top of one another.

In a photovoltaic cell, light is absorbed near the p-n junction generating carriers. The carriers diffuse into the p-n junction and are separated by the built-in electric field, thus producing an electrical current across the device and external circuitry. An important metric in determining a photovoltaic cell's quality is its energy-conversion efficiency, which is defined as the ratio between power converted (from absorbed light to electrical energy) and power collected when the photovoltaic cell is connected to an electrical circuit.

For homojunction photovoltaic cells, minority-carrier recombination at the cell surface due to the existence of dangling bonds can significantly reduce the photovoltaic cell efficiency; thus, a good surface passivation process is needed. In addition, the relatively thick, heavily doped emitter layer, which is formed by dopant diffusion, can drastically reduce the absorption of short wavelength light. Comparatively, heterojunction photovoltaic cells, such as Si heterojunction (SHJ) photovoltaic cells, are advantageous. FIG. 1 presents a diagram illustrating an exemplary SHJ photovoltaic cell (prior art). SHJ photovoltaic cell 100 includes front grid electrode 102, heavily doped amorphous-silicon (a-Si) emitter layer 104, intrinsic a-Si layer 106, crystalline-Si substrate 108, and back grid electrode 110. Arrows in FIG. 1 indicate incident sunlight. Because there is an inherent bandgap offset between a-Si layer 106 and crystalline-Si (c-Si) layer 108, a-Si layer 106 can be used to reduce the surface recombination velocity by creating a barrier for minority carriers. The a-Si layer 106 also passivates the surface of crystalline-Si layer 108 by repairing the existing Si dangling bonds. Moreover, the thickness of heavily doped a-Si emitter layer 104 can be much thinner compared to that of a homojunction photovoltaic cell. Thus, SHJ photovoltaic cells can provide a higher efficiency with higher open-circuit voltage ($V_{oc}$) and larger short-circuit current ($J_{sc}$).

It has also been shown that tunneling-based heterojunction devices can provide excellent open-circuit voltage ($V_{oc}$) from the combination of the field effect and surface passivation. To form such devices, ultra-thin quantum-tunneling barrier (QTB) layers are deposited on one or both sides of a crystalline Si base layer. However, the film quality of such ultra-thin QTB layers is very sensitive to environmental factors. Gaseous contaminants and moisture in the atmosphere can often cause degradation of the QTB layers and the corresponding junction structures, which leads to reduction of photovoltaic cell performance. Conventional cleanroom technologies have been widely deployed in integrated circuit (IC) fabrication. However, the fabrication of photovoltaic cells can be different from conventional IC fabrication. For example, the throughput of photovoltaic cell manufacturing facilities, in terms of the number of wafer processed, can often be much higher than that of IC manufacturing facilities. The footprint of a high-throughput photovoltaic cell manufacturing facilities can also be significantly larger than that of an IC manufacturing facility. The cost of implementing cleanroom capabilities throughout the entire photovoltaic cell fabrication facility can be prohibitively high.

SUMMARY

A method is described for protecting photovoltaic cells. During the fabrication process, a photovoltaic cell can be received from a first processing station. The photovoltaic cell can have at least one exposed surface, which may include crystalline silicon or oxidized crystalline silicon. The photovoltaic cell can then be placed in a controlled microenvironment with controlled chemical content, which can protect the exposed surface of the photovoltaic cell from contamination. Subsequently, the photovoltaic cell can be moved toward and delivered to a second processing station in the controlled microenvironment.

In a variation of this embodiment, wet processing, chemical vapor deposition, or a combination thereof can be performed on the photovoltaic cell in the first processing station.

In a variation of this embodiment, wet processing, chemical vapor deposition, physical vapor deposition, or any combination thereof can be performed on the photovoltaic cell in the second processing station.

In a variation of this embodiment, in the microenvironment, the density of at least one chemical that can contaminate or react with the exposed surface of the photovoltaic cell can be controlled.

In a further variation, the microenvironment can remove 70% or more of $NO_x$, $NH_3$, $SO_x$, $H_2S$, volatile organic compound, or any combination thereof.

In a variation of this embodiment, the relative humidity in the microenvironment can be maintained below 20%.

In a further variation, the system can monitor a humidity parameter, a chemical density parameter, a particulate density parameter, or any combination thereof.

In a variation of this embodiment, the system can measure performance of a photovoltaic structure fabricated on the photovoltaic cell after the photovoltaic cell is processed by the second processing station.

In a variation of this embodiment, the microenvironment can be filled with at least one gas that does not react with the exposed surface of the photovoltaic cell.

In a further variation, the gas can be maintained at a purity of at least 99.9% and a pressure of between 760 and 770 Torr.

In a variation of this embodiment, the microenvironment is a room, a tunnel, a container, or any combination thereof.

BRIEF DESCRIPTION OF THE FIGURES

In the figures, like reference numerals refer to the same figure elements.

DETAILED DESCRIPTION

Figure 1:
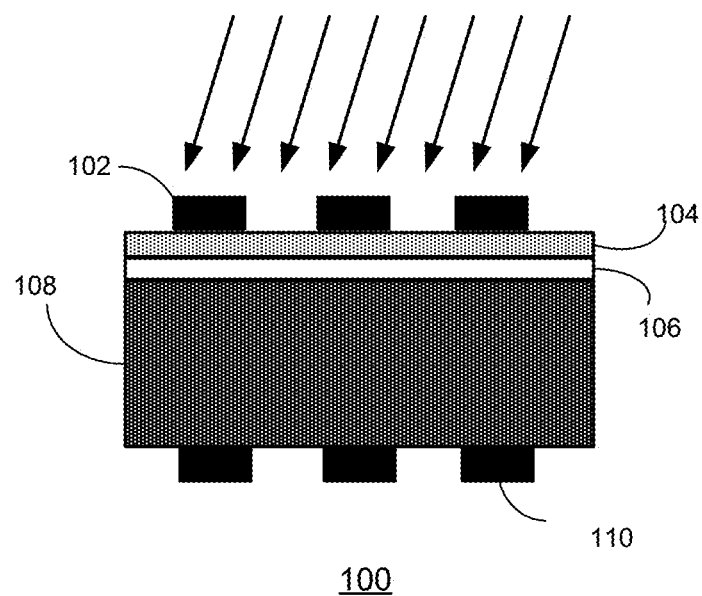
FIG. 1 shows an exemplary SHJ photovoltaic cell (prior art).

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

OVERVIEW

Embodiments of the present invention provide a system and method for improving the manufacturing yield of high-efficiency photovoltaic cells. During the fabrication of tunneling-junction photovoltaic cells, the microenvironment of locations where unfinished wafers are stored between processes can be carefully controlled to minimize degradation to the intermediate layers on the wafers. One benefit, among others, of the present invention is that it provides a controlled microenvironment, which can be configured to be portable, to accommodate wafers between processes, thereby protecting vulnerable wafer surfaces from potential contamination and/or degradation. The provision of such a microenvironment can support a large manufacturing throughput without requiring the entire facility or surrounding environment to be turned into a cleanroom or cleanroom-like environment, which can bring significant cost savings. Furthermore, a portable microenvironment can be transported and assembled in such a way to accommodate a particular layout of a facility, thereby allowing for customizing the location where various process stations are deployed. The portability of a microenvironment is also advantageous because as many of such microenvironments can be deployed overtime to accommodate a growing scale of production. In contract, a fixed cleanroom-like environment cannot accommodate an increase in the scale of production.

One of the distinctions between the microenvironment described herein and a conventional cleanroom environment is that in embodiments of the present invention the microenvironment is a portion of the entire facility and surrounding environment, which may be regulated by a regular heating, ventilating and air conditioning (HVAC) system. In contrast, a conventional cleanroom typically has an entire facility under control and the surrounding environment is subject to a particular standard. Furthermore, the microenvironment described herein can be portable. In other words, the microenvironment can be an enclosed space that can be moved from one place to another. These features allow the wafers to be protected cost-efficiently when they are vulnerable between processing steps.

In some embodiments, water-based air purifiers and gas phase chemical filters can be used to remove gaseous contaminants, such as $SO_x$, $H_2S$, $NO_x$, $NH_3$, volatile organic compounds (VOCs), etc., and other particulates from the microenvironment. The air purification system can include a three-stage purification process: (1) mist wash to remove particulates and gross pollutants in the air, (2) dehumidification, and (3) chemical filtering to remove harmful chemicals in gas form. The microenvironment can be implemented as an airtight nitrogen-filled cabinet, a room, or a tunnel between processing stations.

In this disclosure, the term "photovoltaic cell" can refer to any photovoltaic structure capable of converting light energy to electrical energy. Solar cells are one type of photovoltaic cells that are typically used to covert sunlight to electrical energy. Furthermore, "photovoltaic cell" can refer to a completed cell, or an intermediary product that is not yet a finished product, such as a wafer.

Fabrication Facility

Figure 2:
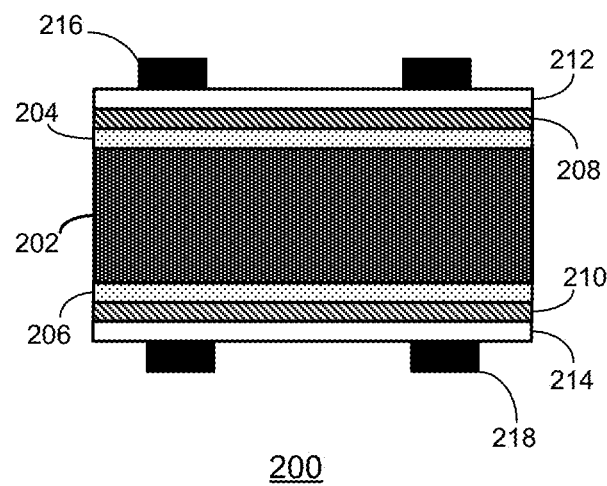
FIG. 2 shows an exemplary double-sided tunneling junction photovoltaic cell.

It has been shown that a special type of SHJ photovoltaic cells (i.e., tunneling junction photovoltaic cells) can provide superior performance because the quantum-tunneling barrier (QTB) layers can effectively passivate the surfaces of the base layer without compromising the carrier collection efficiency. The tunneling junction can be located at either or both sides of the photovoltaic cell. FIG. 2 presents a diagram illustrating an exemplary double-sided tunneling junction photovoltaic cell. Double-sided tunneling junction photovoltaic cell 200 can include base layer 202, quantum tunneling barrier (QTB) layers 204 and 206 covering both surfaces of base layer 202 and passivating the surface-defect states, front-side doped a-Si layer forming front emitter 208, backside doped a-Si layer forming a BSF layer 210, front transparent conducting oxide (TCO) layer 212, back TCO layer 214, front metal grid 216, and back metal grid 218. The main advantage of the tunneling junction is that the ultra-thin tunneling oxide layer deposited on either or both sides of the base layer enables a very low interface defect density ($D_{it}$), which can be less than $1 \times 10^{11}/cm^2$, without significantly increasing the series resistance associated with tunneling through such an oxide layer. As a result, a high efficiency photovoltaic cell with open-circuit voltage ($V_{oc}$) that is larger than 715 mV can be achieved. Details, including fabrication methods, about double-sided tunneling junction photovoltaic cell 200 can be found in U.S. Pat. No. 8,686,283, entitled "Solar Cell with Oxide Tunneling Junctions," by inventors Jiunn Benjamin Heng, Chentao Yu, Zheng Xu, and Jianming Fu, filed 12 Nov. 2010, the disclosure of which is incorporated by reference in its entirety herein.

It is also possible to have the emitter layer on the backside and a front surface field (FSF) layer on the front side of the photovoltaic cell to achieve a back junction photovoltaic cell with improved performance. Placing the heavily p-type doped emitter (assuming that the base layer is n-type doped) on the backside of the photovoltaic cell can minimize current loss due to short wavelength absorption near the front surface of the photovoltaic cell. Similarly, when placed on the backside, the p-type doped emitter can be relatively thick to eliminate emitter depletion effects without compromising on current loss due to short wavelength absorption. As a result of the majority of carrier depletion being reduced, the cell's open-circuit voltage and fill factor is expected to improve. In addition, the back junction structure also provides more flexibility to tune the p-type doped emitter's work function to better match the work function of the back TCO material, or allows the usage of a better optimized backside TCO material without being limited by its transmission properties. Moreover, because the back junction is mostly impacted by long-wavelength, low-energy absorption, it is less affected by high-energy, excessive carrier recombination at the junction. Details, including fabrication methods, about a back junction photovoltaic cell with tunnel oxide can be found in U.S. patent application Ser. No. 13/601,441, entitled "Back Junction Solar Cell with Tunnel Oxide," by inventors Jiunn Benjamin Heng, Jianming Fu, Zheng Xu, and Zhigang Xie, filed 31 Aug. 2012, the disclosure of which is incorporated by reference in its entirety herein.

In order to fabricate photovoltaic cells with high efficiency, such as efficiency of at least 20%, it is desirable to carefully control the quality of the passivation layers, such as the thin QTB layers, and the interface between the layers that form the tunneling junctions. Any degradation in passivation could lead to a lowered minority carrier lifetime, which can negatively impact the performance of the fabricated photovoltaic cells. Moreover, as the expected conversion efficiency for photovoltaic cells continues to increase with innovations in device structures, the product yield can be increasingly dependent upon factors that might not have been critical in the manufacturing process before. For instance, when the expected conversion efficiency of photovoltaic cells is at 15-18%, the efficiency of photovoltaic cells is mainly determined by the device structure and quality of fabrication. The effect of the chemicals in the atmosphere to which a wafer is exposed might not play a significant role in determining the final product yield. However, as the device structure design continues to improve, when the expected efficiency is above 20%, the effect of the atmosphere and the duration of a wafer's exposure to the atmosphere can be a significant factor in determining the final product yield. In other words, moisture, chemicals, and contaminants in the atmosphere may not have been an issue before, until the expected conversion efficiency of photovoltaic cells has exceeded 20%.

When manufacturing crystalline silicon (c-Si) based photovoltaic cells, the c-Si wafer typically undergoes a wet process first, which can include surface cleaning and texturizing. The ultra-thin QTB layers that passivate the surfaces of the c-Si substrate can be formed via a dry oxidation process inside a furnace, plasma enhanced chemical deposition (PECVD) deposition, chemical oxidation, steam oxidation, or low pressure radical oxidation (LPRO), among others. For example, a mono-atomic layer of $SiO_2$ or SiO can be formed by a furnace-based dry oxidation process or PECVD process on the surface of a c-Si wafer. In another embodiment, the crystalline silicon wafer can undergo a hot water bath, as part of the wet process, to form a thin layer of silicon oxide on both surfaces of the wafer. Such a bath can be conducted in de-ionized water with a temperature ranging from 60° C. to 90° C. The duration of the bath can be determined based on the desired thickness of the tunneling oxide layer. Alternatively, or additionally, a thin layer (approximately 10 angstroms thick) of intrinsic semiconductor (which can be amorphous) may also be deposited or formed on the c-Si wafer or the tunneling oxide layers to act as QTB layers. Such a thin layer of oxide and/or intrinsic semiconductor is very fragile and its integrity can be damaged by contaminants or moisture in the environment.

In a typical production line, c-Si wafers after each processing step can be kept in a wafer-holding area to dry off and/or to wait for subsequent processing, such as dry oxidation, chemical vapor deposition (CVD), or physical vapor deposition (PVD). Such a wafer-holding area is conventionally an open space within the photovoltaic cell fabrication facility. In fact, a common industry practice is to store wafers in cassettes and place them in the room where the previous processing station is or where the next-step deposition equipment resides. Because of the difference in throughputs between the wet process (which forms the QTB layers) and the subsequent CVD processes (which form the emitter and field surface layers), the waiting time may vary for c-Si wafers emerging from the same wet process. It has been observed that the differences in waiting time (meaning that the wafers have been exposed to the contaminants in the environment for different time periods) before the CVD process can result in performance differences of the fabricated photovoltaic cells, while some photovoltaic cells fail to meet the efficiency requirement. In other words, the yield of the photovoltaic cell production line can be compromised. Hence, as the wafers are kept in the wafer-holding area for longer periods of time, the efficiency of the final products can be worsened. This problem could be more prominent when larger wafers (such as 6-inch wafers instead of 5-inch wafers) are used for photovoltaic cell fabrication.

Such performance degradation is partially caused by the various contaminants in the atmosphere attacking various layers exposed to the environment between difference processes, such as the surface of cleaned c-Si wafer, the thin QTB layer, or the emitter/surface field layer, causing degradation in passivation or junction quality. Also, most large-scale photovoltaic cell fabrication facilities lack sufficient environmental control due to their size. It is not practical to build a sufficiently large cleanroom to house a large-scale photovoltaic cell production line. Moreover, even if it were possible to put such a production line in a sufficiently large cleanroom, it might still be insufficient to prevent damage to various surfaces and layers in the photovoltaic cell structure, such as the thin QTB layers, because most cleanrooms are, in fact, classified according to the number and size of particles permitted per unit volume of air. For example, "class 100" denotes that the number of particles of size 0.5 µm or larger permitted per cubic foot of air is 100. Gaseous contaminants and humidity level, on the other hand, are often not strictly controlled in a standard cleanroom environment. More particularly, standard high efficiency particulate air (HEPA) filters or ultra low penetration air (ULPA) filters installed in most cleanrooms are often not capable of removing gaseous contaminants. However, certain gaseous contaminants, such as $SO_2$, $H_2S$, $NO_2$, $NH_3$, and volatile organic compounds (VOCs), especially when mixed with moisture, can cause damage to the layers and interfaces of a photovoltaic cell. Therefore, it is important to remove not only dust particles but also these gaseous contaminants and moisture from the fabrication environment. However, due to the size of the photovoltaic cell fabrication facility, which can be hundreds of thousands of square feet, it can be impractical to install chemical and moisture filtration equipment for the entire facility.

In order to increase yield, embodiments of the present invention provide a method and system that facilitate controlled microenvironments between processing stations such that silicon wafers can remain in the controlled microenvironments while waiting for the next process. The controlled microenvironment can be substantially segregated, either by physical boundaries or by flows of a purge gas, from the larger environment of the fabrication facility. Particulates, moisture, and gaseous contaminants can be removed from the controlled microenvironment to prevent environmental damage to the photovoltaic cell junctions. In some embodiments, the controlled microenvironment can be implemented as an airtight, nitrogen-filled cabinet, a separate room whose temperature, humidity, chemical content, and particle content are closely monitored and controlled, or an airtight nitrogen-filled tunnel.

In some embodiments, a specially designed room located within the photovoltaic cell fabrication facility, sometimes referred to as a dry room, can be used for holding the wafers while they are waiting for the next process. For example, if the next process is CVD, the dry room may house the CVD tool and provide sufficient space for holding wafers waiting for the CVD process or between difference CVD processes. Wafers emerging from the previous process, such as a wet process that cleans and etches the c-Si wafers, can be immediately placed into the dry room with minimum exposure to the larger environment. In addition to HEPA filters, which provide cleanliness between class 1000 and class 10,000, water-based air purifiers, dehumidifiers, and chemical filters are installed in the dry room to remove gaseous contaminants, such as $NO_x$, $NH_3$, $SO_x$, $H_2S$, VOCs, etc. For example, in addition to the conventional cleanroom filtering modules, the system can include a three-stage purification mechanism, which includes a mist-based washing module to remove particulates and pollutants, a dehumidifier, and a chemical filtering module. In further embodiments, the chemical removal efficiency of the chemical filters is maintained at above 70%, preferably at above 80%, and more preferably at above 95%. Temperature and humidity are carefully controlled to desired levels within the dry room to prevent damage to the passivation layers caused by excessive moisture. In some embodiments, the temperature of the dry room is kept between 15 and 27° C., preferably at 23° C., and the absolute humidity is kept below 5 g/kg, preferably between 1.3 and 4.0 g/kg. The relative humidity is maintained below 20%, preferably at 13±5%.

In further embodiments, other smaller, physically enclosed wafer-holding apparatus or wafer enclosures, such as airtight, enclosed carts and cabinets, can be placed within the dry room to further reduce possible contamination to the photovoltaic cell junctions/passivation layers. More specifically, these wafer enclosures can be filled with at least one type of gas that does not react with the surface of the photovoltaic structure (e.g., thin silicon oxide layer or intrinsic crystalline or amorphous silicon layer), such as purified nitrogen gas ($N_2$), to ensure greater environmental control. The purified $N_2$ can have a purity of at least 99.9%, preferably around 99.95%. In some embodiments, the cleanliness within the carts/cabinets is kept at class 100. The amount of $O_2$ is kept below 300 parts per million (ppm), and the amount of moisture or water vapor is kept at below 1000 ppm, preferably below 100 ppm. The pressure within the carts/cabinet can be kept between 700 and 800 Torr. In one embodiment, the pressure can be at 760-770 Torr, so that the air flow can be reduced when the wafers are transported in and out of the carts/cabinet. In some embodiments, the carts and cabinets can be made of chemical-resistance materials, such as polyvinyl chloride (PVC) and/or stainless steel. In addition to keeping these carts or cabinets in the dry room, it is also possible to place them in the larger, generic environment. For example, one can place such carts or cabinets next to the wet station. After the wet processes, wafers can be immediately loaded into the enclosed carts or cabinets to ensure that exposure to the larger, surrounding environment is kept to a minimum. Subsequently, the carts or cabinets can be transported to the next processing station to allow wafers to be loaded directly into the next processing station from the enclosed, controlled environment.

In addition to physically enclosed, self-contained wafer-holding areas, the wafers waiting for further processing can also be placed in a tunnel that connects two processing stations. The tunnel can be airtight, and may be equipped with a conveyor belt and entry/exit load lock chambers. Wafers finishing the first process (such as a wet process) can be loaded into the tunnel, often by robotic arms, through the entry load lock chamber, and are transported by the conveyor belt to the next processing station. In some embodiments, if the next processing station includes a load lock chamber, the exit of the tunnel may be the load lock chamber of the deposition or processing tool. In other words, wafers can enter the next-stage tool directly from the tunnel without any exposure to the larger environment. To ensure environmental control within the tunnel, the tunnel is filled with purified $N_2$ that has a purity of at least 99.9%, preferably around 99.95%. Other environmental control factors in the tunnel are similar to the ones used in the cart/cabinet.

By carefully controlling the microenvironment at places where the wafers are kept between processes, one can ensure that the integrity of the intermediate layers, such as passivation layers, is preserved even for wafers that were kept in such an environment for a relatively long time. The effective passivation on all wafers, regardless of their waiting time between various processes, significantly improves the overall yield of the photovoltaic cell production line.

Figure 3:
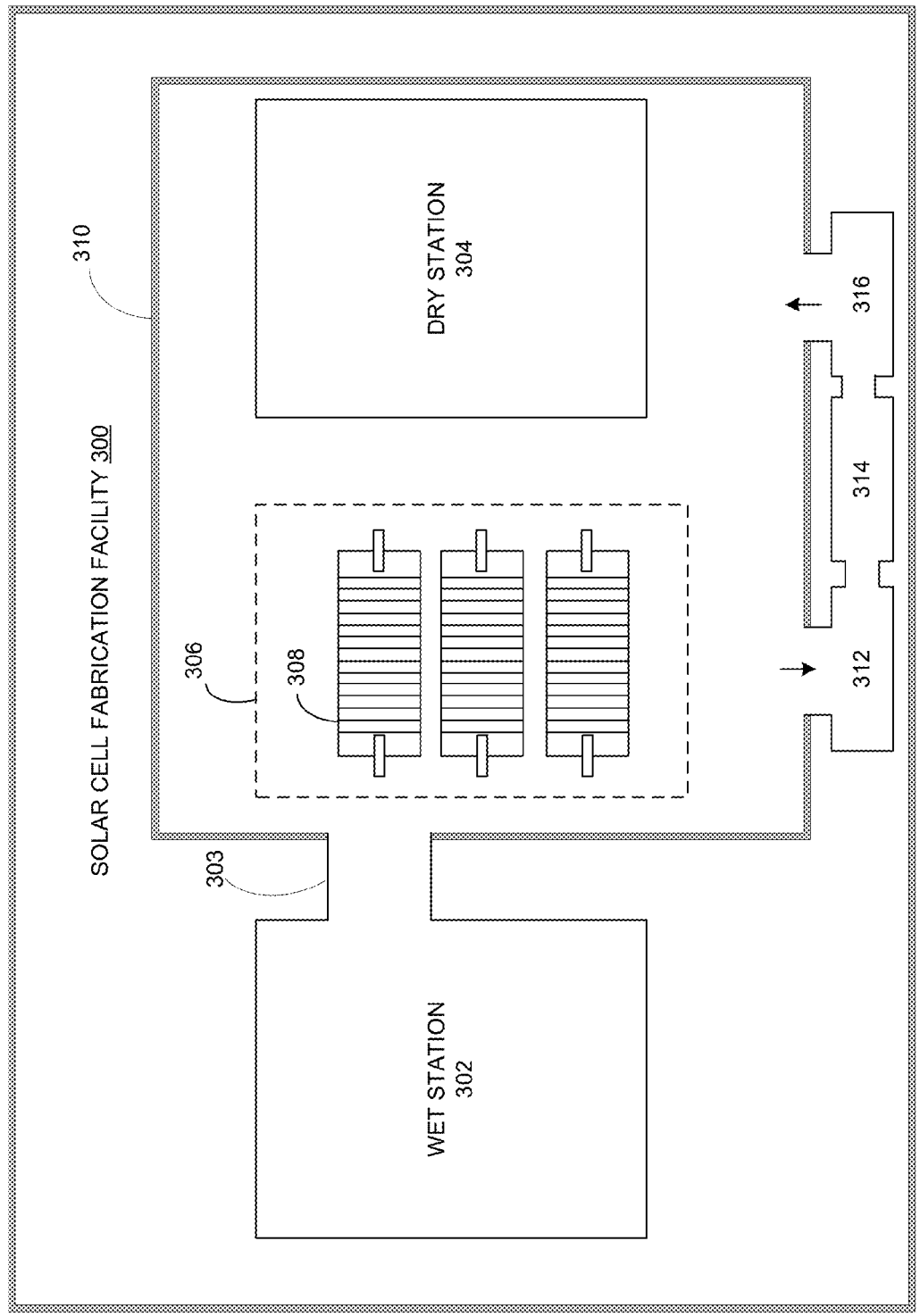
FIG. 3 shows an exemplary photovoltaic cell fabrication facility, according to an embodiment of the present invention.

FIG. 3 shows an exemplary photovoltaic cell fabrication facility, according to an embodiment of the present invention. In FIG. 3, photovoltaic cell fabrication facility 300 includes various processing stations for fabricating a photovoltaic cells, such as wet station 302 and dry station 304. Photovoltaic cell fabrication facility 300 can also include one or more wafer-holding areas where the wafers are temporarily stored while waiting for the next process, such as wafer-holding area 306.

Photovoltaic cell fabrication facility 300 can include any industrial-sized room or building for fabrication of photovoltaic cells. In some embodiments, photovoltaic cell fabrication facility 300 can be well over 10,000 sq. ft. Wet station 302 can be used to perform any process that involves a solution, including but not limited to: surface cleaning, surface texturization, wet etching, and steam oxidation. Dry station 304 can include one or more tools that can be used to perform any process that does not involve a solution, including but not limited to: an oxidation tool (such as a furnace-based dry oxidation tool, a CVD tool, or an LPRO tool), one or more emitter/surface-field-layer tools (such as a plasma-enhanced chemical vapor deposition (PECVD) tool), a transparent conductive oxide (TCO) layer tool (such as an electron-beam evaporation tool or a sputtering tool), a dry-etching tool, etc. In some embodiments, dry station 304 is used for forming the tunneling layer, the photovoltaic cell emitter layer, the surface field layer, and the TCO layers, which often involves a CVD and PVD process.

Wafer-holding area 306 can be used to temporarily store silicon wafers that have been processed at wet station 302 and are queuing to be processed in dry station 304. For example, silicon wafers with an ultra-thin oxide layer on one or both sides of the wafers may be placed in wafer-holding area 306 to wait for subsequent CVD processes to deposit the emitter layer and surface field layer. In some embodiments, silicon wafers can be placed in cassettes, such as cassette 308. Multiple cassettes may be placed side-by-side or stacked on top of each other. Note that FIG. 3 shows that the silicon wafers are placed vertically in the cassettes. In practice, depending upon the configuration and the loading requirements of the tools in dry station 304, the cassettes may be placed in such a way that silicon wafers are substantially horizontally oriented. Also, in conventional photovoltaic cell facilities, the wafer-holding areas can typically be in the larger environment of the fabrication facility, which can include various contaminants, such as moisture, particulates, and chemical vapors. Some smaller-scale photovoltaic cell facility may place the production line in a cleanroom. However, most cleanroom standards do not limit the amount of non-particulate contamination within the cleanroom, and HEPA/ULPA filters are ineffective in removing non-particulate contaminants. However, certain airborne contaminants, such as $SO_x$, $NO_x$, $NH_3$, water vapor, ozone, VOCs, etc., included in the cleanroom air can come in contact with the ultra-thin oxide/intrinsic semiconductor layer on one or both sides of the silicon wafers and may damage such an ultra-thin oxide/intrinsic semiconductor layer, thus degrading the passivation. As a result, the final products may exhibit lower efficiency.

Although installing a gas-phase chemical filtration system for the entire fabrication facility may alleviate contamination, such a solution may be impractical due to the size of typical photovoltaic cell fabrication facilities. To solve the contamination problem, in some embodiments of the present invention, the microenvironment within or surrounding wafer-holding area 306 is controlled to prevent contamination to the intermediate layers on the photovoltaic cells. In the example shown in FIG. 3, wafer-holding area 306 and dry station 304 both reside in a dry room 310, which has its own microenvironment that is segregated from the larger, surrounding environment of fabrication facility 300.

Dry room 310 can include a number of environment-control modules, including but not limited to: particulate filtering module 312, temperature and humidity control module 314, and non-particulate filtering module 316. Particulate filtering module 312 can remove particles from dry room 310. In some embodiments, particulate filtering module 312 can include a HEPA filter or an ULPA filter, and a mist-wash module. In further embodiments, dry room 310 can be kept as a class 1000 or a class 10,000 cleanroom with positive pressure maintained in the room. Non-particulate filtering module 314 can remove gas phase contaminants, such as $SO_x$, $NO_x$, $H_2S$, $NH_3$, ozone, VOCs, etc., from dry room 310. Temperature and humidity control module 314 can control the temperature and humidity within dry room 310 to a desired level. In some embodiments, the temperature of the room can be maintained between 15-27° C., preferably at 23° C. The relative humidity can be maintained below 20%, preferably at 13±5%. The absolute humidity can be maintained below 5 g/Kg, preferably at 1.3-4.0 g/Kg. Non-particulate filtering module 316 may include various types chemical filters. In further embodiments, the chemical removal efficiency is maintained at above 70% (meaning that over 70% of the targeted chemicals can be removed), preferably at above 80%, and more preferably at above 95%.

In some embodiments, wafer-holding area 306 can be an open area located in dry room 310. To further eliminate contamination when the wafers are transferred between wet station 302 and dry station 304, wafer-holding area 306 can include airtight, enclosed carts and/or cabinets, which can be wheeled or otherwise transported from wet station 302 to dry station 304. In other words, the controlled microenvironment can be made portable and allowed to move within facility 300. In some embodiments, the carts or cabinets can be made with chemical-resistant materials, such as PVC or stainless steel. The enclosed carts or cabinets can be filled with purified $N_2$ with a purity of at least 99.9%, preferably around 99.95%. The pressure of nitrogen within the carts/cabinets can be maintained at 700-800 Torr, preferably at 760-770 Torr. The level of particulate within the carts/cabinets can be kept at class 100 or better. Other environmental factors, such as oxygen level, temperature, and humidity, can also be controlled within the carts/cabinets. For example, the oxygen level can be maintained at below 300 ppm. The temperature can be maintained between 15-27° C., preferably at 25° C. The moisture ($H_2O$ vapor) level can be maintained below 1000 ppm, preferably below 100 ppm. In further embodiments, wet station 302 can be connected to wafer-holding area 306 via an air-tight, optionally nitrogen-filled tunnel 303, which can be controlled with a similar set of parameters as an airtight cart or cabinet.

Figure 4:
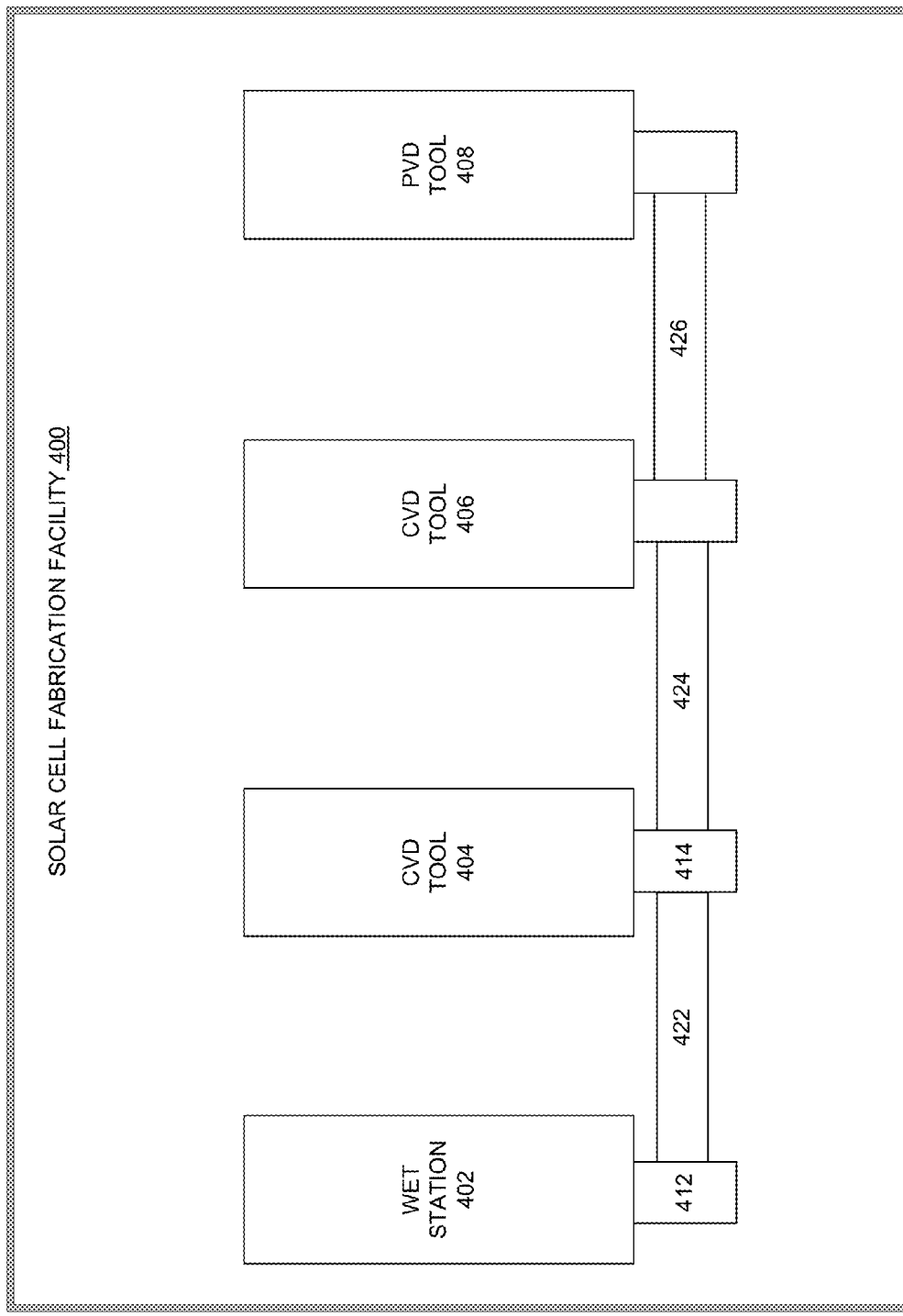
FIG. 4 shows an exemplary photovoltaic cell fabrication facility, according to an embodiment of the present invention.

FIG. 4 shows an exemplary photovoltaic cell fabrication facility, in accordance with an embodiment of the present invention. In FIG. 4, photovoltaic cell fabrication facility 400 can include a number of processing tools, such as wet station 402, CVD tool 404, CVD tool 406, and PVD tool 408.

Wet station 402 can include various baths or rinses that can be used for surface cleaning, surface texturization, passivation, and oxidation. Multiple silicon wafers can be placed in a cassette that is placed in the bath or under the rinse for batch processing.

CVD tool 404 can be used for material deposition on a first side of the silicon wafers (for example, for forming a tunneling layer and/or subsequently depositing the emitter layer). CVD tool 406 can be used for material deposition on a second side of the silicon wafers (for example, for forming a second tunneling layer and/or subsequently depositing the surface field layer). PVD station 408 can be used for the deposition of a TCO layer on one or both sides of the wafers.

To protect unfinished silicon wafers and ensure minimum exposure to the larger environment of fabrication facility 400, each processing tool can include an enclosed load/unload area where silicon wafers (in cassettes or other types of carriers) are loaded into or unloaded from the processing tool. These load/unload areas are also known as buffers between the processing tool and the larger environment of fabrication facility 400. For example, wet station 402 can include a load/unload buffer 412, and CVD tool 404 includes a load/unload buffer 414. Such load/unload buffers may include physically enclosed space, such as an airtight chamber or cabinet. In some embodiments, the load/unload buffers can be built with chemical-resistant materials, such as PVC or stainless steel. The buffers (such as a chamber or a cabinet) can be filled with purified $N_2$ with a purity of at least 99.9%, preferably around 99.95%. The pressure of nitrogen within the chamber/cabinet can be maintained at 700-800 Torr, preferably at 760-770 Torr. The level of particulate within the chamber/cabinet can be kept at class 100 or better. Other environmental factors, such as oxygen level, temperature, and humidity, can be controlled within the chamber/cabinet. The oxygen level can be maintained below 300 ppm. The temperature can be maintained between 15-27° C., preferably at 25° C. The moisture ($H_2O$ vapor) level can be maintained below 1000 ppm, preferably below 100 ppm.

In some embodiments, the load/unload buffers can be moved between the process stations, hence allowing the wafers to stay protected during such transportation. In further embodiments, to prevent exposure of the unfinished wafers to the larger environment, a tunnel can be placed between the load/unload buffers of the different tools. For example, a tunnel 422 is placed between buffer 412 of wet station 402 and buffer 414 of CVD tool 404. As a result, wafers that have been processed by wet station 402 can be transported to CVD tool 404 via tunnel 422, and are not exposed to the larger environment of fabrication facility 400 during transportation. Moreover, wafers can also be kept within tunnel 422 while waiting for the CVD process. The microenvironment within the tunnel is similar to the ones in the load/unload buffers. In some embodiments, the tunnels are built with chemical-resistant materials, such as PVC or stainless steel. In some embodiments, the tunnels can be filled with purified $N_2$ with a purity of at least 99.9%, preferably around 99.95%. The pressure of nitrogen within the tunnels can be maintained at 700-800 Torr, preferably at 760-770 Torr. The level of particulate within the tunnels can be kept at class 100 or better. Other environmental factors, such as oxygen level, temperature, and humidity, can be controlled within the tunnels. The oxygen level can be maintained at below 300 ppm. The temperature can be maintained between 15-27° C., preferably at 25° C. The moisture ($H_2O$ vapor) level can be maintained at below 1000 ppm, preferably below 100 ppm. It is also to use a combination of portable wafer enclosures and tunnels. For example, portable wafer enclosures such as air tight carts or cabinets can be used to transport wafers from wet station 402 and CVD tool 404, and one or more tunnels can be used between CVD tools 404 and 406.

In the example shown in FIG. 4, photovoltaic cell fabrication facility 400 includes two CVD tools for back-to-back deposition of both sides of the wafers. Because standard CVD tools already have load lock chambers, it is possible to build a tunnel that connects the load lock chambers of the two CVD tools such that wafers finishing processing at CVD tool 404 are transported to CVD tool 406 via tunnel 424 without being exposed to the larger environment. Additional $N_2$-filled buffers can also be built around each CVD tool, in case a CVD tool is temporarily offline.

Fabrication Process

Figure 5:
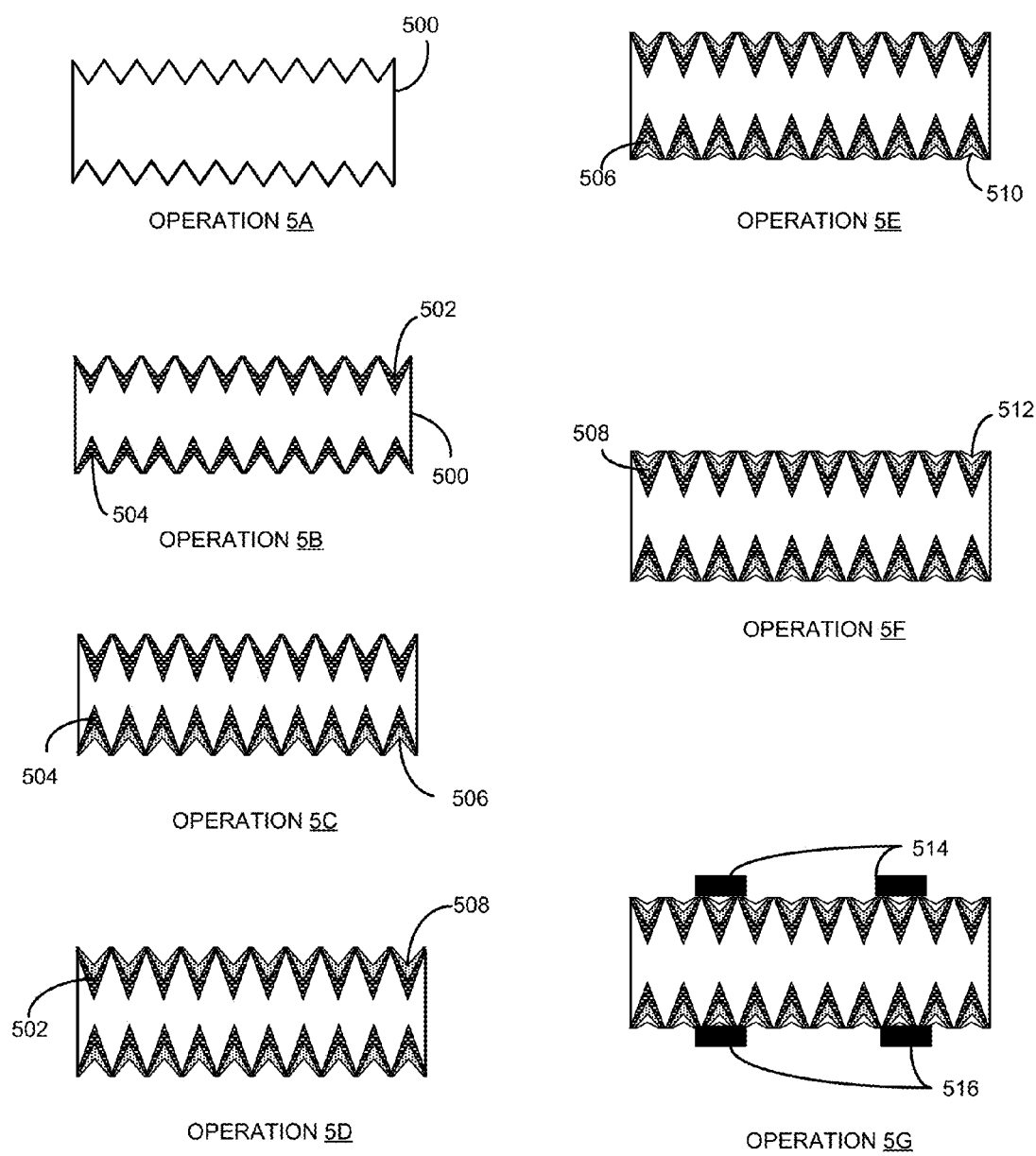
FIG. 5 shows an exemplary process of fabricating a photovoltaic cell, according to an embodiment of the present invention.

Either n- or p-type doped high-quality photovoltaic-grade silicon (SG-Si) wafers can be used to build the back junction photovoltaic cell. In one embodiment, an n-type doped SG-Si wafer is selected. FIG. 5 shows an exemplary process of fabricating a photovoltaic cell, according to an embodiment of the present invention.

In operation 5A, SG-Si substrate 500 is prepared. The thickness of SG-Si substrate 500 can range between 80 and 500 µm. In one embodiment, the thickness of SG-Si substrate 500 can be between 90 and 120 µm. The resistivity of SG-Si substrate 500 is typically in, but not limited to, the range between 1 Ω·cm and 10 Ω·cm. In one embodiment, SG-Si substrate 500 has a resistivity between 1 Ω·cm and 2 Ω·cm. The preparation operation can include saw damage etching that removes approximately 10 µm of silicon and surface texturing. The surface texture can have various patterns, including but not limited to: hexagonal-pyramid, inverted pyramid, cylinder, cone, ring, and other irregular shapes. In one embodiment, the surface texturing operation results in a random pyramid textured surface. Afterwards, SG-Si substrate 500 goes through extensive surface cleaning. Note that in FIG. 5 the texture pattern is not drawn to the actual scale and is enlarged to illustrate the texture. Actual texture pattern would be much smaller compared with the surface dimensions. Note that operation 5A may include one or more wet process, such as texturization and rinse.

In operation 5B, a thin layer of high-quality (with $D_{it}$ less than $1 \times 10^{11}/cm^2$) dielectric material is formed or deposited on the front and back surfaces of SG-Si substrate 500 to form front and back passivation/tunneling layers 502 and 504, respectively. In one embodiment, only the back surface of SG-Si substrate 500 is covered with a thin layer of dielectric material. Various types of dielectric materials can be used to form the passivation/tunneling layers, including, but not limited to: silicon oxide ($SiO_x$), hydrogenated $SiO_x$, silicon nitride ($SiN_x$), hydrogenated $SiN_x$, aluminum oxide ($AlO_x$), silicon oxynitride (SiON), and hydrogenated SiON. In addition, various oxidation and/or deposition techniques can be used to form the passivation/tunneling layers, including, but not limited to: thermal oxidation, atomic layer deposition, wet or steam oxidation, low-pressure radical oxidation, plasma-enhanced chemical-vapor deposition (PECVD), LPRO, etc. The thickness of passivation/tunneling layers 502 and 504 can be between 1 and 50 angstroms. In one embodiment, the thickness of passivation/tunneling layers 502 and 504 is between 1 and 15 angstroms. Note that the well-controlled thickness of the passivation/tunneling layers ensures good tunneling and passivation effects. Subsequent to operation 5B, the unfinished wafer is placed into an ultra-clean microenvironment that is substantially segregated from the surrounding environment of the photovoltaic cell fabrication facility. The environmental factors, such as particulate count, temperature, humidity, pressure, etc., can be controlled in the microenvironment. In addition, gaseous contaminants, such as $SO_x$, $NO_x$, $NH_3$, $H_2S$, ozone, VOCs, can be substantially removed from the microenvironment to ensure the integrity of passivation/tunneling layers. The unfinished photovoltaic cells are kept in the ultra-clean, controlled microenvironment until the next operation. Note that if operation 5B is a dry process, the wafer can be placed in the ultra-clean microenvironment subsequent to operation 5A.

In operation 5C, a layer of hydrogenated, graded-doping a-Si having a doping type opposite to that of substrate 500 can be deposited on the surface of back passivation/tunneling layer 504 to form an emitter layer 506. As a result, emitter layer 506 is positioned on the backside of the photovoltaic cell facing away from the incident sunlight. Note that, if c-Si substrate 500 is n-type doped, then emitter layer 506 is p-type doped, and vice versa. In one embodiment, emitter layer 506 can be p-type doped using boron as dopant and can be formed using a CVD technique, such as PECVD. SG-Si substrate 500, back passivation/tunneling layer 504, and emitter layer 506 form the hetero-tunneling back junction. The thickness of emitter layer 506 can be between 1 and 20 nm. Note that an optimally doped (with doping concentration varying between $1 \times 10^{15}/cm^3$ and $5 \times 10^{20}/cm^3$) and sufficiently thick (at least between 3 nm and 20 nm) emitter layer can ensure a good ohmic contact and a large built-in potential. In one embodiment, the region within emitter layer 506 that is adjacent to back passivation/tunneling layer 504 can have a lower doping concentration, and the region that is away from back passivation/tunneling layer 504 can have a higher doping concentration. The lower doping concentration can reduce defect density at the interface between back passivation/tunneling layer 504 and emitter layer 506, and the higher concentration on the other side can prevent emitter layer depletion. The work function of emitter layer 506 can be tuned to better match that of a subsequently deposited back transparent conductive oxide (TCO) layer to enable larger $V_{oc}$ and a higher fill factor. In addition to a-Si, it is also possible to use other material, including but not limited to: one or more wide-bandgap semiconductor materials and polycrystalline Si, to form emitter layer 506. Subsequent to operation 5C, the unfinished photovoltaic cell is placed into an ultra-clean microenvironment to wait for the next operation.

In operation 5D, a layer of hydrogenated, graded-doping a-Si having a doping type same as that of substrate 500 can be deposited on the surface of front passivation/tunneling layers 502 to form front surface field (FSF) layer 508. Note that, if c-Si substrate 500 is n-type doped, then FSF layer 508 is also n-type doped, and vise versa. In one embodiment, FSF layer 508 is n-type doped using phosphorous as dopant. In some embodiments, FSF layer 508 can be formed using a CVD technique, such as PECVD. C-Si substrate 500, front passivation/tunneling layer 502, and FSF layer 508 form the front surface tunneling junction that effectively passivates the front surface. In one embodiment, the thickness of FSF layer 508 can be between 1 and 30 nm. In one embodiment, the doping concentration of FSF layer 508 can vary from $1 \times 10^{15}/cm^3$ to $5 \times 10^{20}/cm^3$. In addition to a-Si, it is also possible to use other material, including but not limited to: wide-bandgap semiconductor materials and polycrystalline Si, to form FSF layer 508. Subsequent to operation 5D, the unfinished photovoltaic cell is optionally placed into an ultra-clean microenvironment to wait for the next operation. Note that, once the junctions (both the front and the back junctions) are formed, the photovoltaic cell, although not yet finished, is less sensitive to environmental factors. Therefore, placing and keeping the unfinished photovoltaic cells in the ultra-clean microenvironment can be optional after operation 5D.

In operation 5E, a layer of TCO material can be deposited on the surface of emitter layer 506 to form a back-side conductive anti-reflection layer 510, which ensures a good ohmic contact. Examples of TCO include, but are not limited to: indium-titanium-oxide (ITiO), indium oxide ($In_2O_3$), indium-tungsten-oxide (IWO), indium-tin-oxide (ITO), indium-zinc-oxide (IZO), tin-oxide ($SnO_x$), aluminum doped zinc-oxide (ZnO:Al or AZO), Zn—In—O (ZIO), gallium doped zinc-oxide (ZnO:Ga), and other large bandgap transparent conducting oxide materials. The work function of back-side TCO layer 510 can be tuned to better match that of emitter layer 506. In some embodiment, a sputtering technique is used to form back-side TCO layer 510.

In operation 5F, front-side TCO layer 512, which can have a similar material composition as back-side TCO layer 510, is formed on the surface of FSF layer 508. Front-side TCO layer 512 forms a good anti-reflection coating to allow maximum transmission of sunlight into the photovoltaic cell. Note that operation 5E and 5F can occur with the same PVD process, or can occur with two separate sputtering processes, using the same or different TCO materials.

In operation 5G, front-side electrode 514 and back-side electrode 516 are formed on the surfaces of TCO layers 512 and 510, respectively. In one embodiment, front-side electrode 514 and back-side electrode 516 include metal grids, wherein the metal can include Cu, Ag, Al, Au, or any conductive material. The conductive grid can be formed using various techniques, including, but not limited to: electroplating, screen printing of a metal paste, inkjet or aerosol printing of a conductive ink, and evaporation. In one embodiment, front-side electrode 514 and/or back-side electrode 516 can include Cu grid formed using various techniques, including, but not limited to: electroless plating, electro plating, sputtering, and evaporation. Note that the existence of the back-side TCO layer and the fact that the back-side electrode includes a metal gird make it possible for the fabricated photovoltaic cell to operate in a bi-facial manner, i.e., to receive light from both the front and the back side.

Although the example illustrated in FIG. 5 is based on a back-heterojunction device structure, embodiments of the present invention can be applied to various, different device structures, such as photovoltaic cells whose emitter is on the front side, or photovoltaic cells whose electrodes of both polarities are on the back side (i.e., with an interdigitated backside contacts, IBC).

Note that the example shown in FIG. 5 shows that the fabrication of photovoltaic cell follows the order of "center to surface". In other words, the fabrication starts from the central base layer, and other layers are deposited one by one on both sides of base layer. The advantage of such an arrangement is that the junctions on both sides can be formed sequentially without any intermediate steps in between. Once the junctions are formed, the photovoltaic cell becomes more robust and is less likely to degrade due to environment factors, thus making subsequent fabrication operations simpler. In practice, it is also possible to first form the various layers on one side of the base layer, and then flip the wafer over to form the various layers on the other side of the base layer. The advantage of such an arrangement is that the wafer only needs to be flipped one time. However, strict control of the microenvironments where the photovoltaic cell is transported and held between fabrication operations is needed for most of the operations, because the junctions are not completed until near the end.

Figure 6:
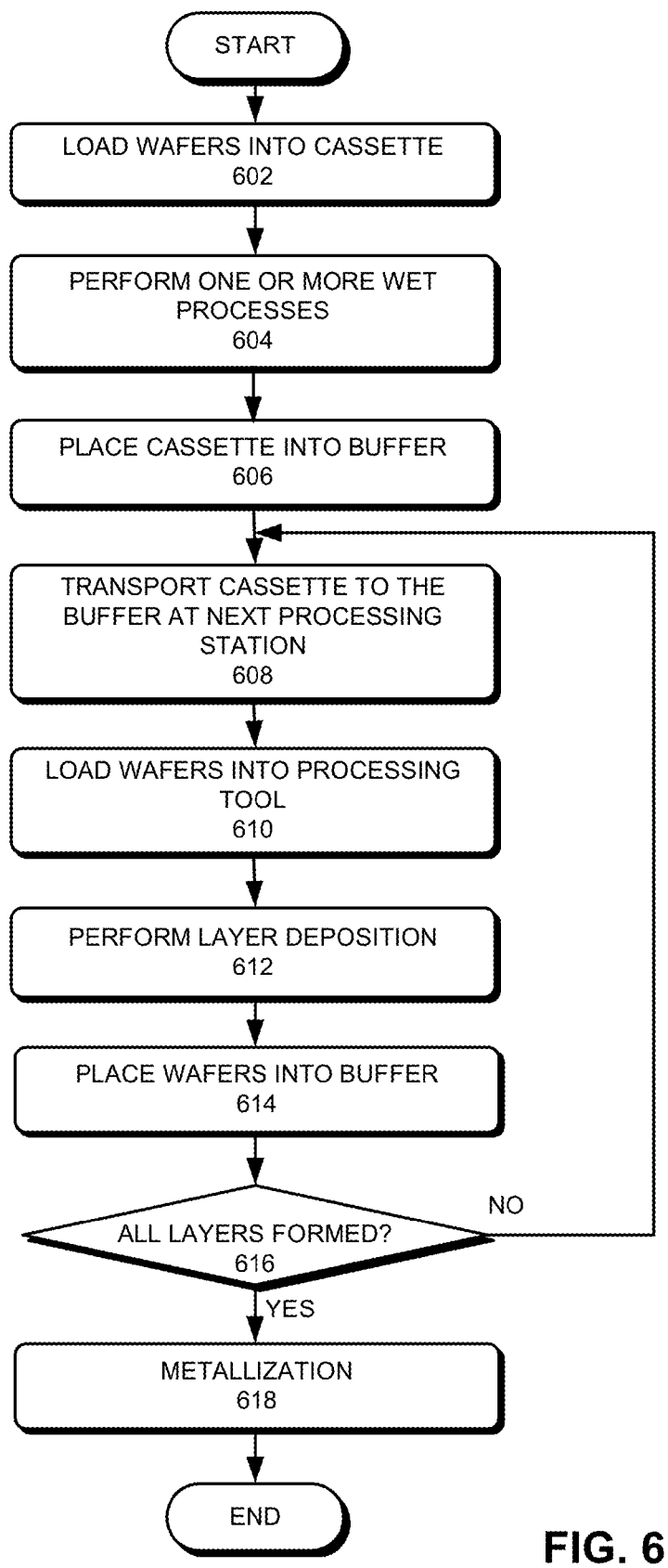
FIG. 6 shows the operation of an exemplary photovoltaic cell production line, according to an embodiment of the present invention.

FIG. 6 shows the operation of an exemplary photovoltaic cell production line, according to one embodiment of the present invention. At the start of the production line, a number of photovoltaic cell wafers can be first loaded into a cassette (operation 602). In some embodiments, the photovoltaic cell wafers include 6 inch by 6 inch square silicon wafers or 6 inch by 6 inch pseudo square (such as squares with rounded corners) silicon wafers. The cassette can undergo one or more wet processes (operation 604). The cassette may be dipped into one or more baths or go through one or more rinses. Subsequent to the last wet process, the cassette (along with wafers within) is placed into a load/unload buffer (operation 606). The load/unload buffer can include a chamber or a cabinet that is airtight and filled with purified $N_2$. The microenvironment within the load/unload buffer can be controlled to ensure that the wafers do not come into contact with various contaminants, including but not limited to: dust particles, harmful chemical vapors, aerosols, moisture, VOCs, etc., that may exist in the larger environment of the fabrication facility.

The cassette can be kept in the load/unload buffer until it is time for the next process, at which point the cassette is transported from the load/unload buffer from the wet station to the load/unload buffer of the next processing station, which can be an oxidation tool or CVD tool (operation 608). In some embodiments, the cassette can be transported via an enclosed tunnel connecting the two load/unload buffers. In some embodiments, the cassette can be transported via a $N_2$-filled cart. Subsequently, wafers are loaded from the cassette into the processing tool (operation 610). In some embodiments, the processing tool can be located in a room separated from the rest of the fabrication facility. The microenvironment within this separated room can be controlled to remove various contaminants, including but not limited to: dust particles, harmful chemical vapors, aerosols, moisture, VOCs, etc., that may exist in the larger environment of the fabrication facility. As a result, when wafers are loaded from the cassette into processing tool, they are not exposed to the various contaminants. Subsequently, the wafers can undergo a material formation or deposition process, such as an oxidation or CVD process (operation 612). After the deposition process, if the junctions or the layer structure are not yet completed, the wafers are loaded into another buffer to wait for the next process (operation 614). Operations 608-614 may repeat until all layers, including the emitter layer, the field surface layer, and the front and back TCO layers are formed (operation 616). The photovoltaic cells are then ready for metallization (operation 618). Note that the combination of the tunneling-junction structure and the carefully controlled wafer loading/transport microenvironments within the photovoltaic cell fabrication facility ensures that the large-scale photovoltaic cell production line can manufacture photovoltaic cells with an efficiency of at least 20% at a high yield.

Figure 7:
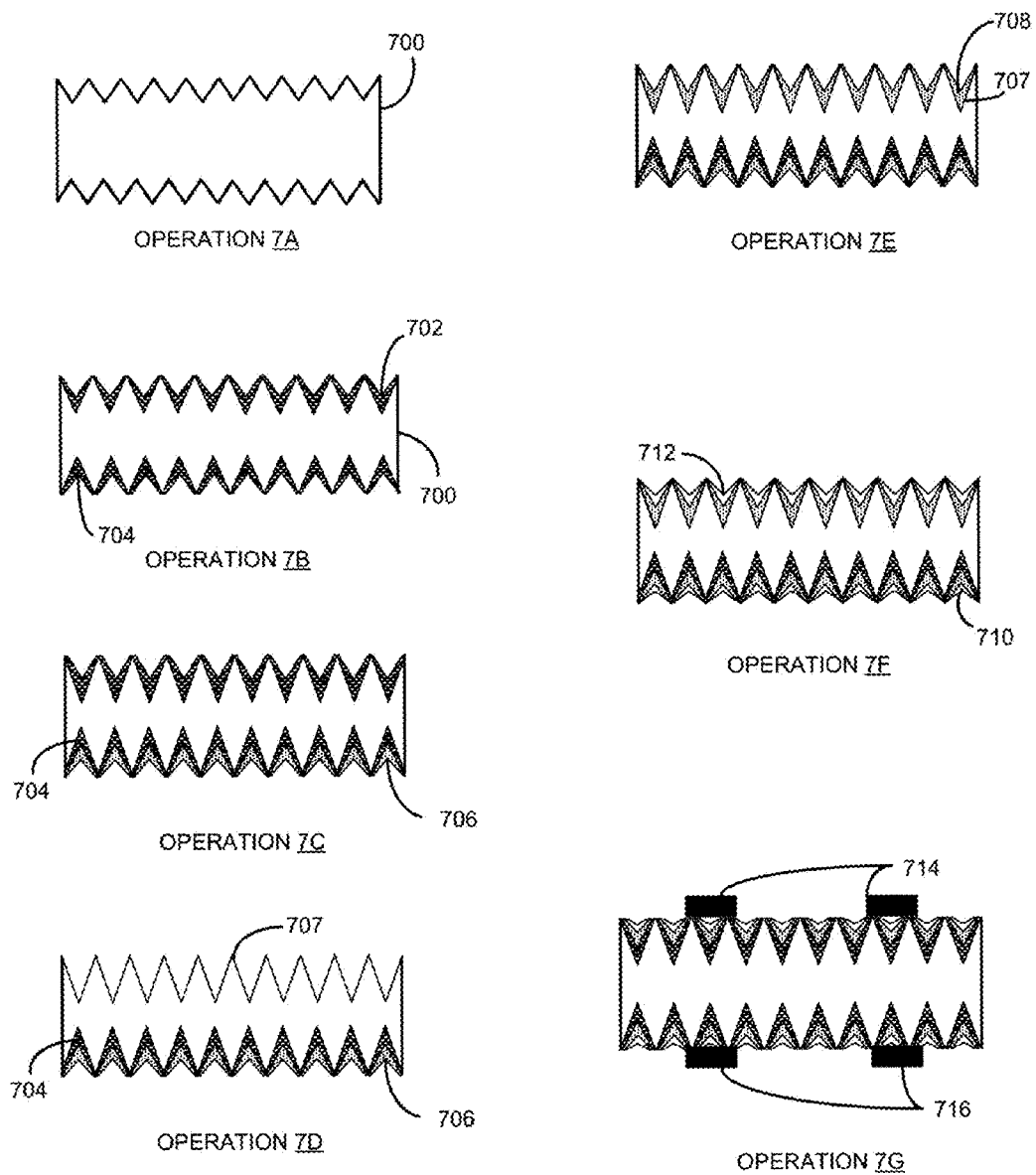
FIG. 7 shows an exemplary process of fabricating a photovoltaic cell, according to an embodiment of the present invention.

In a further embodiment, a slightly varied fabrication method can be used to manufacture the aforementioned photovoltaic cell. FIG. 7 shows such an exemplary method, according to one embodiment of the present invention. In operation 7A, SG-Si wafer 700 is prepared, similar to operation 5A. This preparation operation can include saw damage etching that removes approximately 10 µm of silicon and surface texturing. In one embodiment, the surface texturing operation results in a random pyramid textured surface. Afterwards, SG-Si wafer 700 goes through extensive surface cleaning. In FIG. 7 the texture pattern is not drawn to the actual scale and is enlarged to illustrate the texture. Actual texture pattern would be much smaller compared with the surface dimensions. Note that operation 7A may include one or more wet processes.

In operation 7B, thin tunneling oxide layers 702 and 704 can be formed on the front and back surfaces of SG-Si substrate 700, respectively. In one embodiment, oxide layers 702 and 704 are formed by immerging wafer 700 in heated de-ionized water. The temperature of the de-ionized water can be from 60° C. to 90° C. The duration of the hot water bath can be selected such that the tunneling oxide layers 702 and 704 are between 1 and 50 angstroms. In one embodiment, the thickness of tunneling oxide layers 702 and 704 is between 1 and 15 angstroms. These thin tunneling oxide layers can be vulnerable to the chemicals in the air when the surfaces of wafer 700 are exposed. Subsequent to operation 7B, wafer 700 is retained in a controlled microenvironment that can protect the surfaces of wafer 700 from potential contamination and/or reaction with the chemicals in the air. The environmental factors, such as particulate count, temperature, humidity, pressure, etc., can be controlled in the microenvironment. Gaseous contaminants, such as $SO_x$, $NO_x$, $NH_3$, $H_2S$, ozone, VOCs, can be substantially removed from the microenvironment to ensure the integrity of tunneling layers. As described above, the microenvironment can be a room, cart, cabinet, or a tunnel. Other types of wafer enclosures are also possible.

In operation 7C, doped a-Si emitter layer 706 having a doping type opposite to that of substrate 700 can be deposited on the surface of back passivation/tunneling layer 704. In one embodiment, c-Si wafer 700 is n-type doped, and emitter layer 706 is p-type doped. Emitter layer 706 can formed by adding boron in a CVD deposition process. SG-Si substrate 700, back passivation/tunneling layer 704, and emitter layer 706 form the hetero-tunneling back junction. The thickness of emitter layer 706 can be between 1 and 20 nm. An optimally doped (with doping concentration varying between $1 \times 10^{15}/cm^3$ and $5 \times 10^{20}/cm^3$) and sufficiently thick (at least between 3 nm and 20 nm) emitter layer can ensure a good ohmic contact and a large built-in potential. In one embodiment, the region within emitter layer 706 that is adjacent to back passivation/tunneling layer 704 can have a lower doping concentration, and the region that is further away from back passivation/tunneling layer 704 can have a higher doping concentration. The lower doping concentration can reduce defect density at the interface between back passivation/tunneling layer 704 and emitter layer 706, and the higher concentration on the other side can prevent emitter layer depletion. Optionally, a layer of intrinsic a-Si can be deposited between passivation/tunneling layer 704 and emitter layer 706 (e.g., by turning of the boron doping during the beginning of the CVD process).

The CVD process in operation 7C is performed tunneling oxide layer 704, which can be very thing (e.g., on the order of 10 angstroms). Before the CVD process, this thin oxide layer can be vulnerable due to potential contamination and reaction with chemicals and moisture in the air. Storing and/or transporting the wafer in the microenvironment can protect the wafer from such contamination.

During the deposition step in operation 7C, wafer 700 is most likely placed on a wafer carrier with its back side facing upward inside the CVD chamber to allow emitter layer 706 to be deposited. As a result, tunneling oxide layer 702 can be in contact with the wafer carrier, which can cause contamination to oxide layer 702. In one embodiment, as shown in operation 7D, front tunneling oxide layer 702 can optionally be removed by an additional wet etching step to expose c-Si surface 707. Because tunneling oxide layer 702 is less critical on the junction between the base layer and subsequently deposited front surface field layer, removal of tunneling oxide layer 702 might not significantly impair the photovoltaic cell performance. In addition, because tunneling oxide layer 702 is now used as a sacrificial layer and removed to expose a "fresh" layer of c-Si on wafer 700, the subsequently grown junction can be substantially free of defectives. After tunneling oxide layer 702 is removed, wafer 700 can be stored and/or transported in the microenvironment to protect the exposed c-Si surface 707.

In operation 7E, a layer of doped a-Si having a doping type same as that of substrate 700 can be deposited on exposed crystalline silicon surface 707 to form front surface field (FSF) layer 708. In one embodiment, c-Si substrate 700 is n-type doped, and FSF layer 708 is also n-type doped using phosphorous as dopant. FSF layer 708 can be formed using a CVD technique. C-Si substrate 700 and FSF layer 708 form the front surface junction. In one embodiment, the thickness of FSF layer 708 can be between 1 and 30 nm. The doping concentration of FSF layer 708 can vary from $1 \times 10^{15}/cm^3$ to $5 \times 10^{20}/cm^3$. In addition to a-Si, it is also possible to use other material, including but not limited to: wide-bandgap semiconductor materials and polycrystalline Si, to form FSF layer 708. Optionally, a layer of intrinsic a-Si can be deposited between c-Si surface 707 and FSF layer 708 to improve passivation. Subsequent to operation 7E, the unfinished photovoltaic cell can be optionally placed and/or transported in an ultra-clean microenvironment while waiting for the next operation. After the junctions (both the front and the back junctions) are formed, the photovoltaic cell, although not yet finished, is less sensitive to environmental factors. Therefore, placing the unfinished photovoltaic cells in the ultra-clean microenvironment can be optional after operation 7E.

In operation 7F, a layer of TCO material can be deposited on both sides of wafer 700, forming front-side and back-side conductive anti-reflection layers 712 and 710, respectively. The TCO material used in this step can be similar to that used in operation 5E. In one embodiment, one or two separate PVD steps, such as sputtering, can be used to form TCO layers 510 and 512.

In operation 7G, front-side and back-side electrodes 714 and 716 can be formed on the surfaces of TCO layers 712 and 710, respectively. The techniques used for forming these electrodes can be similar to that used in operation 5G.

Figure 8:
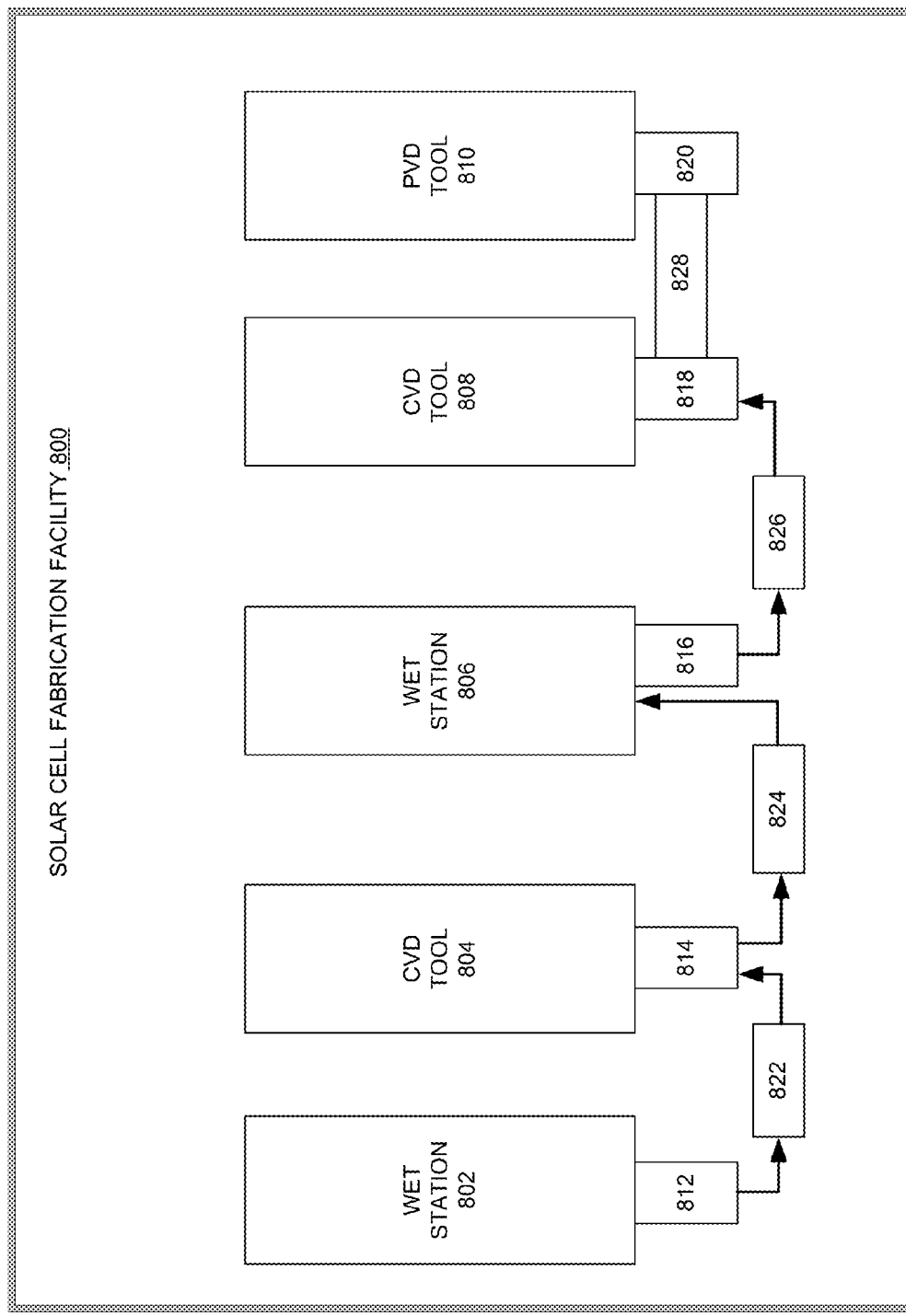
FIG. 8 shows an exemplary facility for fabricating a photovoltaic cell, according to an embodiment of the present invention.

FIG. 8 shows an exemplary photovoltaic cell fabrication facility 800 configured to perform the operations shown in FIG. 7, according to one embodiment of the present invention. In this example, photovoltaic cell fabrication facility 800 includes wet processing station 802, CVD tool 804, wet processing station 806, CVD tool 808, and PVD tool 810. Respectively attached to these processing stations are buffers 812, 814, 816, 818, and 820. During operation, a wafer is first wet-processed in wet station 802, where operations 7A and 7B are performed. During this wet processing, the wafer is cleaned and texturized. In addition, the wafer is oxidized on both sides in a hot bath to form the tunneling oxide layers.

After the first wet processing, the wafer is optionally placed in buffer 812, where it is dried. The wafer is then placed in a microenvironment, which in this example can be cabinet 822. The microenvironment inside cabinet 822 is controlled (e.g, filled with nitrogen and/or with chemical/humidity control). Cabinet 822 can protect the thin oxide layers from potential contamination. In one embodiment cabinet 822 and buffer 812 can be the same mechanism. That is, buffer 812 can be a cabinet that can be attached to and detached from wet processing station 802. The same configuration can also be applied to buffers 814, 816, and 818.

The wafer is then sent to CVD tool 804 via buffer 814, and undergoes a first CVD process to have its back-side emitter layer formed, as described in operation 7C.

Next, the wafer is optionally placed in another microenvironment 824, which can also be a cabinet. Transporting the wafer in cabinet 824 can be optional because at this moment the wafer's emitter layer is already formed, and the oxide layer on the opposite side serves as a sacrificial layer and will be subsequently removed.

The wafer is then moved to wet processing station 806, which hosts a wet etching process to remove the oxide layer on the side where the front surface field layer is to be deposited. After this wet etching step, the wafer has an exposed surface (c-Si surface) and is moved into cabinet 826 via buffer 816. Like cabinet 824, cabinet 826 also provides a controlled microenvironment to protect the exposed c-Si surface of the wafer. Subsequently, the wafer is transported to CVD tool 808 via buffer 818. CVD tool 808 can be used to deposit the FSF layer, as described in operation 7E. After deposition of the FSF layer, the wafer is removed from CVD tool 808 and optionally placed in microenvironment 828, which in this case can be a tunnel. The wafer is then transported to PVD tool 810 via buffer 820 to form the front-side and back-side TCO layers, as described in operation 7F.

In one embodiment, one or more of the processing stations may be directly connected via a tunnel such as microenvironment 828 and without the need for buffers 818 and 820. For example, the processing speed and throughput of two or more processing stations may be such that a buffer is not needed and a stations are communicatively coupled via a tunnel that forms a controlled microenvironment.

Figure 9:
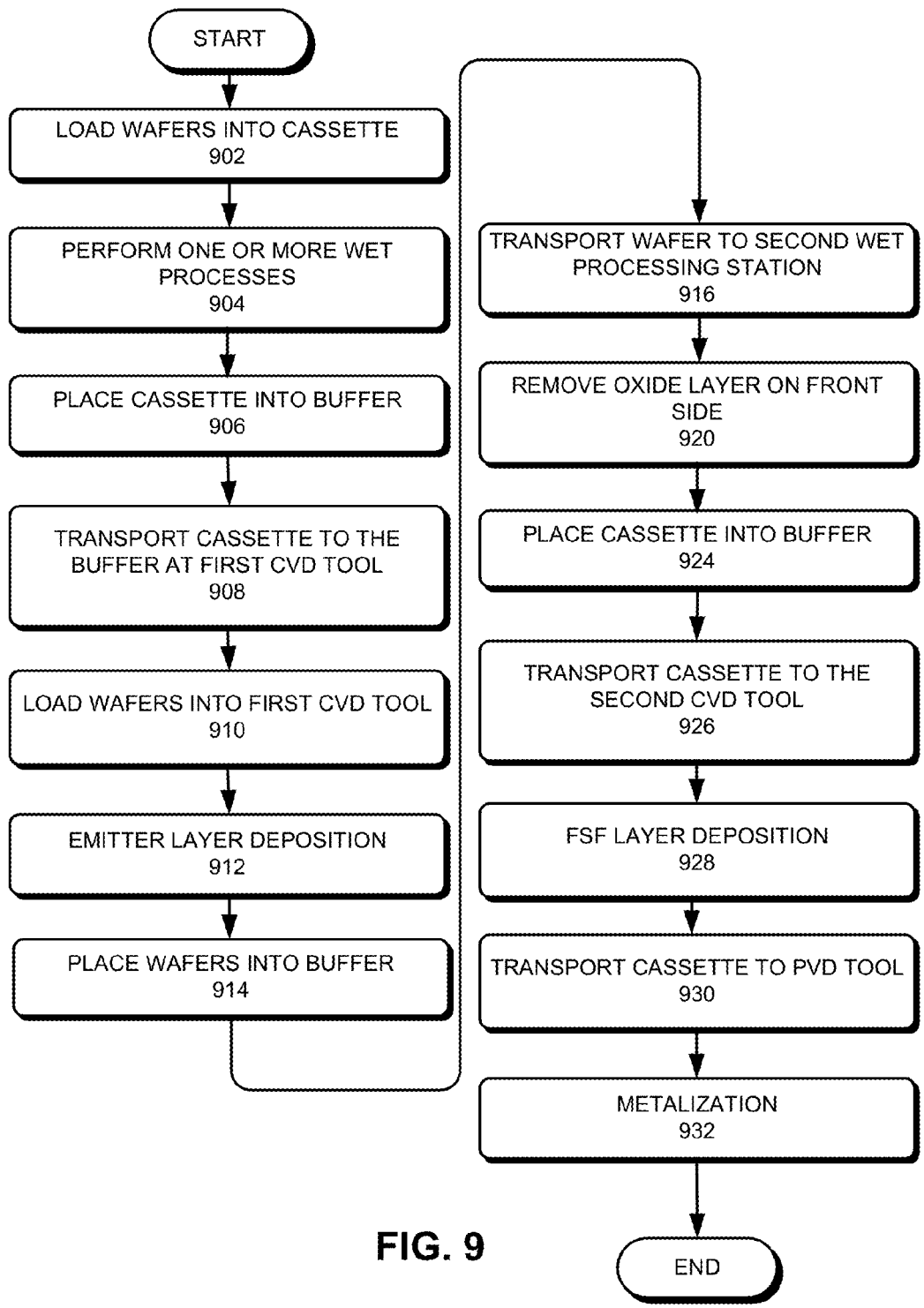
FIG. 9 shows an exemplary process of fabricating a photovoltaic cell, according to an embodiment of the present invention.

FIG. 9 shows the operation of an exemplary photovoltaic cell production line corresponding to FIGS. 7 and 8, according to one embodiment of the present invention. At the start of the production line, a number of photovoltaic cell wafers can be first loaded into a cassette (operation 902). The cassette can undergo one or more wet processes, where the wafers are cleaned, texturized, and oxidized (operation 904). The cassette may be submerged in one or more baths and go through one or more rinses. Subsequent to the last wet process, the cassette (along with wafers within) is placed into a load/unload buffer (operation 906). The load/unload buffer can include a chamber or a cabinet that is airtight and filled with purified $N_2$. The microenvironment within the load/unload buffer can be controlled to ensure that the wafers do not come into contact with various contaminants, including but not limited to: dust particles, harmful chemical vapors, aerosols, moisture, VOCs, etc., that may exist in the surrounding environment of the fabrication facility.

The cassette can be kept in the load/unload buffer until it is time for the next process, at which point the cassette is transported from the load/unload buffer from the wet station to the load/unload buffer of the first CVD tool (operation 908). In some embodiments, the cassette can be transported via an enclosed tunnel connecting the two load/unload buffers. In further embodiments, the cassette can be transported via a $N_2$-filled cart. Subsequently, wafers are loaded from the cassette into the first CVD tool (operation 910). Subsequently, the back-side emitter layer is formed in the first CVD process (operation 912). After the first CVD deposition process, the wafer is placed in the buffer of the first CVD tool (operation 914) and transported to the second wet processing station (operation 916). The second wet processing station then performs a wet etching step on the wafer to remove the oxide layer on the front side where the FSF layer will be deposited (operation 920). As a result, a layer of c-Si is exposed on the front-side surface of the wafer.

Subsequently, the cassette of wafers are placed into another buffer (operation 924) and transported to the second CVD tool in a controlled microenvironment (operation 926). This microenvironment can protect the exposed c-Si surface from potential contamination. The second CVD then deposits the FSF layer on the wafer (operation 928). Next, the cassette of wafers are transported to the PVD tool, optionally in a controlled microenvironment (operation 930). The PVD tool can deposit both the front-side and back-side TCO layers, after which the wafers undergo a metallization process to form the electrodes (operation 932).

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method for protecting processed substrates during fabrication of photovoltaic structures, the method comprising:
   receiving a processed substrate from a first wet processing station, wherein the substrate has at least one exposed surface, and wherein the exposed surface comprises crystalline silicon or oxidized crystalline silicon;
   placing the substrate in a controlled microenvironment filled with a gas that does not react with the exposed surface of the substrate, the gas being maintained at a pressure between 760 and 770 Torr;
   moving the substrate toward a second processing station in the controlled microenvironment; and
   delivering the substrate to the second processing station.

2. The method of claim 1, further comprising performing wet processing, chemical vapor deposition, physical vapor deposition, or any combination thereof on the substrate in the second processing station.

3. The method of claim 1, further comprising:
controlling, in the microenvironment, density of at least one chemical that can contaminate or react with the exposed surface of the substrate.

4. The method of claim 3, wherein controlling density of the at least one chemical comprises removing 70% or more at least one chemical selected from a group consisting of: $NO_x$, $NH_3$, $SO_x$, $H_2S$, and volatile organic compound.

5. The method of claim 1, further comprising:
maintaining a relative humidity in the microenvironment below 20%.

6. The method of claim 1, further comprising:
monitoring at least one microenvironment characteristic selected from a group consisting of a humidity parameter, a chemical density parameter, and a particulate density parameter.

7. The method of claim 1, further comprising:
measuring performance of a photovoltaic structure fabricated on the substrate after the substrate is processed by the second processing station.

8. The method of claim 1, further comprising:
maintaining the gas at a purity of at least 99.9%.

9. The method of claim 1, wherein placing the substrate in the controlled microenvironment comprises placing the substrate in a room.

10. The method of claim 1, wherein placing the substrate in the controlled microenvironment comprises placing the substrate in a tunnel.

11. The method of claim 1, wherein placing the substrate in the controlled microenvironment comprises placing the substrate in a container.

12. A method for protecting substrates between fabrication processes, the method comprising:
receiving a substrate in a substrate enclosure, wherein the substrate has been processed in a wet processing station, and wherein the substrate has at least one exposed surface that comprises crystalline silicon or oxidized crystalline silicon;
retaining the substrate in the substrate enclosure between the fabrication processes, wherein the substrate enclosure is filled with a gas that does not react with the exposed surface of the substrate, the gas being maintained at a pressure between 760 and 770 Torr; and
controlling density of at least one chemical in the substrate enclosure that can contaminate or react with the exposed surface of the substrate, thereby protecting the substrate.

13. The method of claim 12, wherein controlling density of the at least one chemical comprises removing 70% or more at least one chemical selected from a group consisting of: $NO_x$, $NH_3$, $SO_x$, $H_2S$, and volatile organic compound.

14. The method of claim 12, further comprising:
maintaining a relative humidity in the substrate enclosure below 20%.

15. The method of claim 12, further comprising monitoring, in the substrate enclosure, at least one microenvironment characteristic selected from a group consisting of a humidity parameter, a chemical density parameter, and a particulate density parameter.

16. The method of claim 12, further comprising maintaining the gas at a purity of at least 99.9%.

17. A method, comprising:
processing a substrate in a first wet processing station, which exposes at least one surface of the substrate, the surface comprising crystalline silicon or oxidized crystalline silicon;
placing the substrate in a portable substrate enclosure with a controlled microenvironment filled with a gas that does not react with the exposed surface of the substrate, the gas being maintained at a pressure between 760 and 770 Torr, thereby protecting the exposed surface of the substrate from contamination; and
moving the substrate to a second processing station while the substrate is retained in the portable substrate enclosure.

* * * * *